United States Patent
Huang

(10) Patent No.: US 11,641,209 B2
(45) Date of Patent: May 2, 2023

(54) TIME-INTERLEAVED ANALOG TO DIGITAL CONVERTER HAVING RANDOMIZATION AND SIGNAL CONVERSION METHOD

(71) Applicant: REALTEK SEMICONDUCTOR CORPORATION, Hsinchu (TW)

(72) Inventor: Shih-Hsiung Huang, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 111 days.

(21) Appl. No.: 17/491,932

(22) Filed: Oct. 1, 2021

(65) Prior Publication Data
US 2022/0209781 A1 Jun. 30, 2022

(30) Foreign Application Priority Data
Dec. 31, 2020 (TW) .................................. 109147182

(51) Int. Cl.
*H03M 1/38* (2006.01)
*H03M 1/08* (2006.01)

(52) U.S. Cl.
CPC .................................. *H03M 1/0854* (2013.01)

(58) Field of Classification Search
CPC ........ H03M 1/468; H03M 1/804; H03M 1/38; H03M 1/1009; H03M 1/0641; H03M 1/08; H03M 1/46; H03M 1/462; H03M 1/466; H03M 1/1245; H03M 3/426; H03M 1/0673; H03M 1/0639; H03M 1/12; H03M 1/121; H03M 1/124; H03M 1/403; H03M 1/662;

(Continued)

(56) References Cited

U.S. PATENT DOCUMENTS

| 10,003,348 B2 * | 6/2018 | Liu .......................... H03M 1/08 |
| 10,778,242 B2 | 9/2020 | Huang |
| 10,790,843 B2 | 9/2020 | Huang |

(Continued)

OTHER PUBLICATIONS

OA letter of the counterpart TW application (appl. No. 109147182) dated Nov. 4, 2021. Summary of the OA letter: 1. Claim 10 is rejected as allegedly being anticipated by cited reference 1(US 2011/0084860 A1). 2. Claims 1-9 are allowable.

(Continued)

*Primary Examiner* — Linh V Nguyen
(74) *Attorney, Agent, or Firm* — WPAT, PC

(57) ABSTRACT

A time-interleaved analog to digital converter includes capacitor array circuits, at least one successive approximation register circuitry, and at least one noise shaping circuitry. The capacitor array circuits are configured to alternately sample an input signal, in order to generate a sampled input signal. The at least one successive approximation register circuitry is configured to perform an analog to digital conversion according to the sampled input signal and a residue signal, in order to generate at least one digital output. The at least one noise shaping circuitry is configured to utilize at least one first circuit in switched-capacitor circuits to transfer the residue signal from a first capacitor array circuit in the capacitor array circuits, and randomly select at least one second circuit from the switched-capacitor circuits to cooperate with a second capacitor array circuit in the capacitor array circuits to sample the input signal.

20 Claims, 8 Drawing Sheets

(58) Field of Classification Search
CPC ........ H03M 3/47; H03M 1/00; H03M 1/0607; H03M 1/10; H03M 1/1023; H03M 1/1057
USPC ......... 341/118–121, 140, 141, 155, 159, 172
See application file for complete search history.

(56) References Cited

U.S. PATENT DOCUMENTS

| | | | |
|---|---|---|---|
| 11,121,720 B2* | 9/2021 | Weng | H03M 1/121 |
| 2004/0227654 A1* | 11/2004 | Yang | H03M 1/682 |
| | | | 341/172 |
| 2011/0084860 A1 | 4/2011 | Murden et al. | |
| 2012/0001781 A1* | 1/2012 | Scanlan | H03M 1/1004 |
| | | | 341/110 |
| 2015/0180498 A1* | 6/2015 | Yang | H03M 1/1057 |
| | | | 341/161 |
| 2016/0182075 A1* | 6/2016 | Devarajan | H03M 1/121 |
| | | | 341/120 |
| 2016/0352351 A1* | 12/2016 | Miki | H03M 1/0626 |
| 2017/0012637 A1* | 1/2017 | Venca | H03M 1/462 |
| 2019/0131989 A1* | 5/2019 | Maurino | H03M 3/47 |
| 2021/0119637 A1* | 4/2021 | Lin | H03M 1/1245 |
| 2021/0359698 A1* | 11/2021 | Sun | H03M 1/38 |

OTHER PUBLICATIONS

T. Caldwell, D. Alldred and Z. Li, "A Reconfigurable ΔΣ ADC With Up to 100 MHz Bandwidth Using Flash Reference Shuffling," in IEEE Transactions on Circuits and Systems I: Regular Papers, vol. 61, No. 8, pp. 2263-2271, Aug. 2014, doi: 10.1109/TCSI.2014.2333685.

* cited by examiner

TIME-INTERLEAVED ANALOG TO DIGITAL CONVERTER HAVING RANDOMIZATION AND SIGNAL CONVERSION METHOD

BACKGROUND

1. Technical Field

The present disclosure relates to an analog to digital converter. More particularly, the present disclosure relates to an analog to digital converter having randomization and a noise shaping function and a signal conversion method thereof.

2. Description of Related Art

In a mixed signal circuit, a capacitor is normally configured to transfer a signal that is stored in a previous phase. However, in practical applications, if mismatches exist in capacitors, the signal cannot be accurately transferred. As a result, the output of the mixed signal may be affected by noises having a harmonic tone, which results in a lower effective resolution of the mixed signal circuit.

SUMMARY

In some aspects of the present disclosure, a time-interleaved analog to digital converter includes a plurality of capacitor array circuits, at least one successive approximation register circuitry, and at least one noise shaping circuitry. The plurality of capacitor array circuits are configured to alternately sample an input signal, in order to generate a sampled input signal. The at least one successive approximation register circuitry is configured to perform an analog to digital conversion according to the sampled input signal and a residue signal, in order to generate at least one digital output. The at least one noise shaping circuitry is configured to utilize at least one first circuit in a plurality of switched-capacitor circuits to transfer the residue signal from a first capacitor array circuit in the plurality of capacitor array circuits, and randomly select at least one second circuit from the plurality of switched-capacitor circuits to cooperate with a second capacitor array circuit in the plurality of capacitor array circuits to sample the input signal.

In some aspects of the present disclosure, a signal conversion method includes the following operations: alternately sampling, by a plurality of capacitor array circuits, an input signal, in order to generate a sampled input signal; performing an analog to digital conversion according to the sampled input signal and a residue signal, in order to generate at least one digital output; utilizing at least one first circuit in a plurality of switched-capacitor circuits to transfer the residue signal from a first capacitor array circuit in the plurality of capacitor array circuits; and randomly selecting at least one second circuit from the plurality of switched-capacitor circuits to cooperate with a second capacitor array circuit in the plurality of capacitor array circuits to sample the input signal.

These and other objectives of the present disclosure will be described in detailed description with various figures and drawings.

DETAILED DESCRIPTION

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

In this document, the term "coupled" may also be termed as "electrically coupled," and the term "connected" may be termed as "electrically connected." "Coupled" and "connected" may mean "directly coupled" and "directly connected" respectively, or "indirectly coupled" and "indirectly connected" respectively. "Coupled" and "connected" may also be used to indicate that two or more elements cooperate or interact with each other. In this document, the term "circuitry" may indicate a system formed with one or more circuits. The term "circuit" may indicate an object, which is formed with one or more transistors and/or one or more active/passive elements based on a specific arrangement, for processing signals.

As used herein, the term "and/or" includes any and all combinations of one or more of the associated listed items. Although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. For ease of understanding, like elements in various figures are designated with the same reference number.

Figure 1:
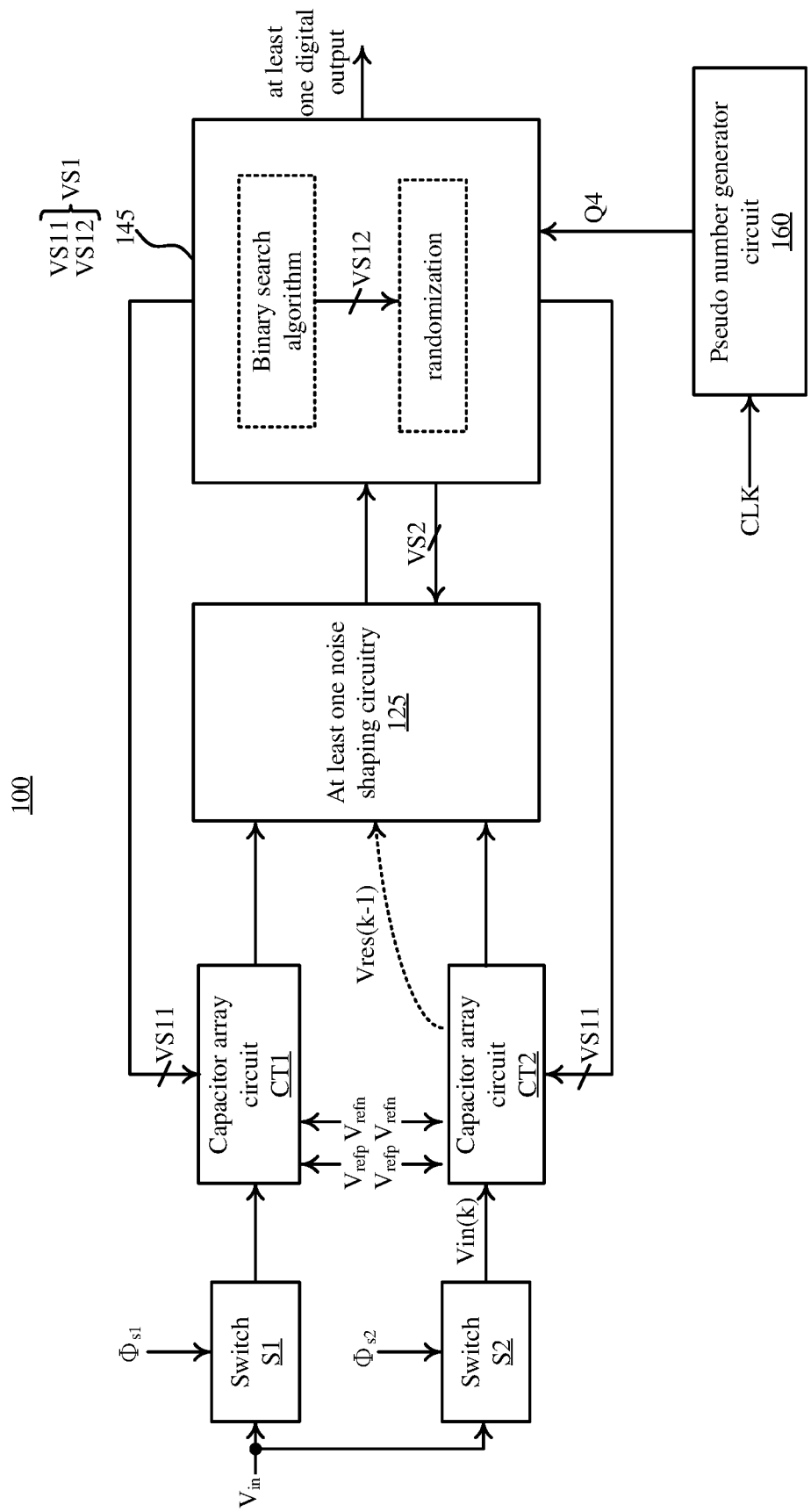
FIG. 1 is a schematic diagram of a time-interleaved analog to digital converter (ADC) according to some embodiments of the present disclosure.

FIG. 1 is a schematic diagram of a time-interleaved analog to digital converter (ADC) 100 according to some embodiments of the present disclosure. In some embodiments, time-interleaved ADC 100 operates as a time-interleaved successive approximation register (SAR) ADC.

The time-interleaved ADC 100 includes a switch S1, a switch S2, a capacitor array circuit CT1, a capacitor array circuit CT2, at least one noise shaping circuitry 125, and at least one SAR circuitry 145.

The switch S1 and the switch S2 are turned on respectively according to a clock signal $\Phi_{S1}$ and a clock signal $\Phi_{S2}$, such that an input signal $V_{in}$ is alternately sampled by the capacitor array circuit CT1 and the capacitor array circuit CT2, in order to generate a corresponding sampled input signal Vin(k). For example, during a phase k, the switch S2 is turned on and the switch S1 is not turned on. Under this condition, the capacitor array circuit CT1 provides the input signal $V_{in}$(k−1) (not shown), which is sampled in a previous phase k−1, to the at least one SAR circuitry 145 for analog to digital conversion, and the capacitor array circuit CT2 samples the current input signal $V_{in}$ to generate a sampled input signal $V_{in}$(k). Afterwards, in phase k+1, the switch S1 is turned on and the switch S2 is not turned on. Under this condition, the capacitor array circuit CT2 provides the sampled input signal $V_{in}$(k) to the at least one SAR circuitry 145 for the analog to digital conversion, and the capacitor array circuit CT1 samples the input signal $V_{in}$, in order to generate a sampled input signal $V_{in}$(k+1) (not shown).

The at least one noise shaping circuitry 125 is configured to receive a residue signal from the capacitor array circuit CT1 or the capacitor array circuit CT2, in order to perform a noise shaping function. For example, during phase k, the capacitor array circuit CT2 provides a residue signal Vres(k−1) generated in a previous phase k−1 to the at least one noise shaping circuitry 125. Afterwards, during phase k+1, the capacitor array circuit CT1 provides a residue signal Vres(k) (not shown) generated in the previous phase k to the at least one noise shaping circuitry 125. In some embodiments, the noise shaping function is performed by integrating the residue signal Vres(k−1) and the sampled input signal $V_{in}$(k).

Figure 2A:
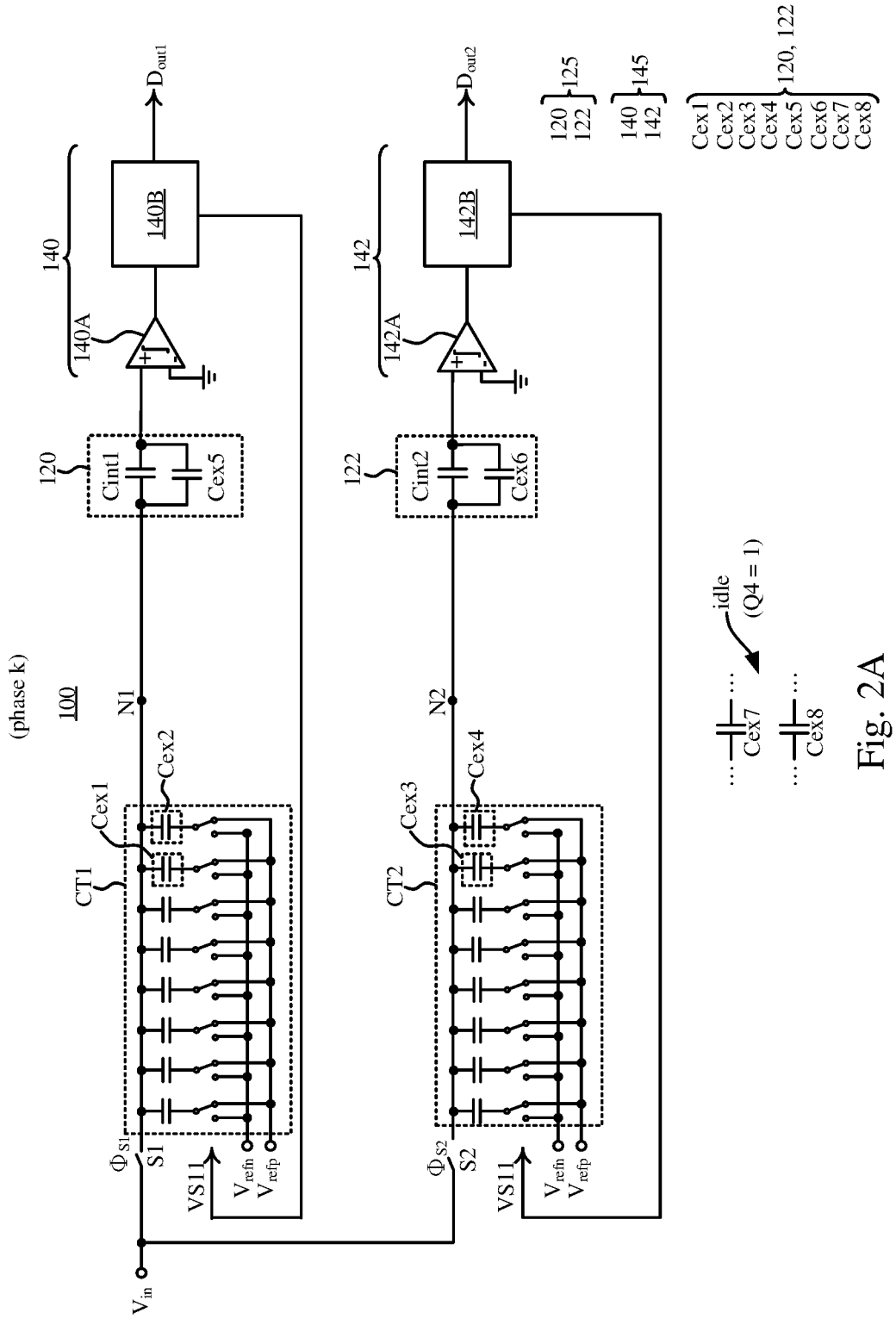
FIG. 2A is a schematic diagram of the time-interleaved ADC in FIG. 1 that operates during a first phase according to some embodiments of the present disclosure.

In some embodiments, the at least one noise shaping circuitry 125 may include switched-capacitor circuits (e.g., switched-capacitor circuits Cex1-Cex8 in FIG. 2A). These switched-capacitor circuits are configured to receive the residue signal from the capacitor array circuit CT1 and the capacitor array circuit CT2, and may cooperate with the capacitor array circuit CT1 or the capacitor array circuit CT2 to sample the input signal $V_{in}$. For example, the at least one noise shaping circuitry 125 may utilize at least one first circuit in the switched-capacitor circuits to transfer the residue signal from the capacitor array circuit CT1 (or the capacitor array circuit CT2), and randomly select at least one second circuit from the switched-capacitor circuits, in order to cooperate with the capacitor array circuit CT2 (or the capacitor array circuit CT1) to sample the input signal $V_{in}$. The at least on first circuit is different from the at least one second circuit. The operations regarding herein will be described with reference to FIG. 2A to FIG. 2D.

The at least one SAR circuitry 145 performs the analog to digital conversion based on the sampled input signal $V_{in}$(k) and a residue signal Vres(k−1), in order to control a corresponding one of the capacitor array circuits CT1 and CT2 to receive a common voltage $V_{refp}$ and a common mode voltage $V_{refn}$ to generate at least one digital output (e.g., digital output $D_{out1}$ and digital output $D_{out2}$ in FIG. 2A).

In some embodiments, time-interleaved ADC 100 further includes a pseudo random number generator circuit 160, which is configured to generate a pseudo random number Q4 according to a predetermined clock signal CLK. The at least one SAR circuitry 145 may perform a binary search algorithm based on the sampled input signal $V_{in}$(k) and the residue signal Vres(k−1) to generate switching signals VS1. A first part VS11 of the switching signals VS1 is for controlling the capacitor array circuit CT1 and the capacitor array circuit CT2, and a second part VS12 of the switching signals VS1 is for controlling switched-capacitor circuits in the at least one noise shaping circuitry 125. The at least one SAR circuitry 145 further adjusts the second part VS12 of the switching signals VS1 according to pseudo random number Q4, in order to generate switching signals VS2. The at least one noise shaping circuitry 125 may random select the at least one second circuit from the switched-capacitor circuits according to the switching signals VS2. Operations regarding herein will be provided with reference to FIG. 2A to FIG. 2D.

In some embodiments, the at least one SAR circuitry 145 includes at least one control logic circuit (e.g., a control logic circuit 140B and a control logic circuit 142B in FIG. 2A) and a randomization circuit. The at least one control logic circuit may be configured to perform the binary search algorithm to generate the switching signals VS1. The randomization circuit may adjust the second part VS12 according to the pseudo random number Q4, in order to generate the switching signals VS2. In some embodiments, each of the at least one control logic circuit and the randomization circuit may be, but not limited to, implemented with one or more logic circuits, a controller circuit, digital signal processor circuit.

In some embodiments, implementations of the time-interleaved ADC 100 can be further understood with reference to a first reference (U.S. Pat. No. 10,778,242) and/or a second reference (U.S. Pat. No. 10,790,843). For example, the capacitor array circuit CT1 and the capacitor array circuit CT2 may be the same as a capacitor CT1 and a capacitor CT2 in these references. In some embodiments, the at least one noise shaping circuitry 125 may include a switching circuitry 120 of the first reference, or may include noise shaping circuitries 120 and 122 in the second reference. In some embodiments, the at least one SAR circuitry 145 may include the SAR circuitry 140 of the first reference, or may include SAR circuitries 140 and 142 of the second reference. Implementations and operations about the at least one noise shaping circuitry 125 and at least one SAR circuitry 145 can be understood with reference to the above references, and thus the repetitious descriptions are not further given.

For ease of understanding, certain implementations and operations of the time-interleaved ADC 100 are described with some embodiments of the second reference, but the present disclosure is not limited thereto. It is understood that various time-interleaved SAR ADCs able to perform the noise shaping function are within the contemplated scope of the present disclosure. For example, in some other embodiments, a terminal (e.g., an electrode of a capacitor) of the at least second circuit, which is randomly selected from the switched-capacitor circuits, may generate a residue signal, and the at least one noise shaping circuitry 125 may perform the noise shaping function to this residue signal.

FIG. 2A is a schematic diagram of the time-interleaved ADC 100 in FIG. 1 that operates during the phase k according to some embodiments of the present disclosure. Similar to the second reference, in this example, the at least one noise shaping circuitry 125 includes a noise shaping circuitry 120 and a noise shaping circuitry 122, in which the noise shaping circuitry 120 includes a capacitor Cint1, and the noise shaping circuitry 122 includes a capacitor Cint2. The noise shaping circuitry 120 and the shaping circuitry 122 commonly includes switched-capacitor circuits Cex1-Cex8. Similar to the second reference, the at least one SAR circuitry 145 includes a SAR circuitry 140 and a SAR circuitry 142, in which the SAR circuitry 140 includes a quantizer circuit 140A and a control logic circuit 140B, and the SAR circuitry 142 includes a quantizer circuit 142A and a control logic circuit 142B. Detailed operations about the above circuits can be understood with reference to the second reference, and thus the repetitious descriptions are not further given.

During the phase k, the switched-capacitor circuit Cex1 and the switched-capacitor circuit Cex2 are coupled between switches in the capacitor array circuit CT1 and a node N1 based on the switching signals VS2, in order to perform the analog to digital conversion. In response to this analog to digital conversion, the residue signal Vres(k) (not shown) will be stored in the switched-capacitor circuit Cex1 and the switched-capacitor circuit Cex2. Based on the switching signals VS2, the switched-capacitor circuit Cex5 and the switched-capacitor circuit Cex6 are coupled to in parallel with the capacitor Cint1 and capacitor Cint2, respectively, in order to transfer the residue signal Vres(k−1) (not shown) that is generated from the capacitor array circuit CT2 in the previous phase k−1.

Compared with the second reference, the noise shaping circuitries 120 and 122 further includes switched-capacitor circuits Cex7-Cex8. In some embodiments, if the pseudo random number Q4 is a first logic value (e.g., a logic value of 0), the at least one noise shaping circuitry 125 utilizes the at least one second circuit (which may be the switched-capacitor circuits Cex7-Cex8 in this example) to cooperate with the capacitor array circuit CT2 to sample the input signal $V_{in}$, in order to generate the sampled input signal $V_{in}$(k). Alternatively, if the pseudo random number Q4 is a second logic value (e.g., a logic value of 1), the at least one noise shaping circuitry 125 utilizes at least one predetermined circuit in the switched-capacitor circuits Cex1-Cex8 (which may be the switched-capacitor circuits Cex3 and Cex4 that are coupled to the at least one noise shaping circuitry 125 during the previous phase k−1; which can be understood with reference to the second reference) to cooperate with the capacitor array circuit CT2 to sample the input signal $V_{in}$, in order to generate the sampled input signal $V_{in}$(k) (not shown).

As shown in FIG. 2A, in this example, the pseudo random number Q4 is the logic value of 1. Under this condition, the at least one noise shaping circuitry 125 utilizes the predetermined switched-capacitor circuits Cex3 and Cex4. Accordingly, during phase k, the switched-capacitor circuits Cex3 and Cex4 are coupled between switches in the capacitor array circuit CT2 and a node N2 based on the switching signal VS2, in order to sample the input signal $V_{in}$ to generate the sampled input signal $V_{in}$(k) (not shown). On the other hand, as the switched-capacitor circuits Cex7 and Cex8 are not utilized in phase k (i.e., disconnected from the capacitor array circuit CT1, the capacitor array circuit CT2, and/or the at least one noise shaping circuitry 125), the switched-capacitor circuits Cex7 and Cex8 stand idle.

Figure 2B:
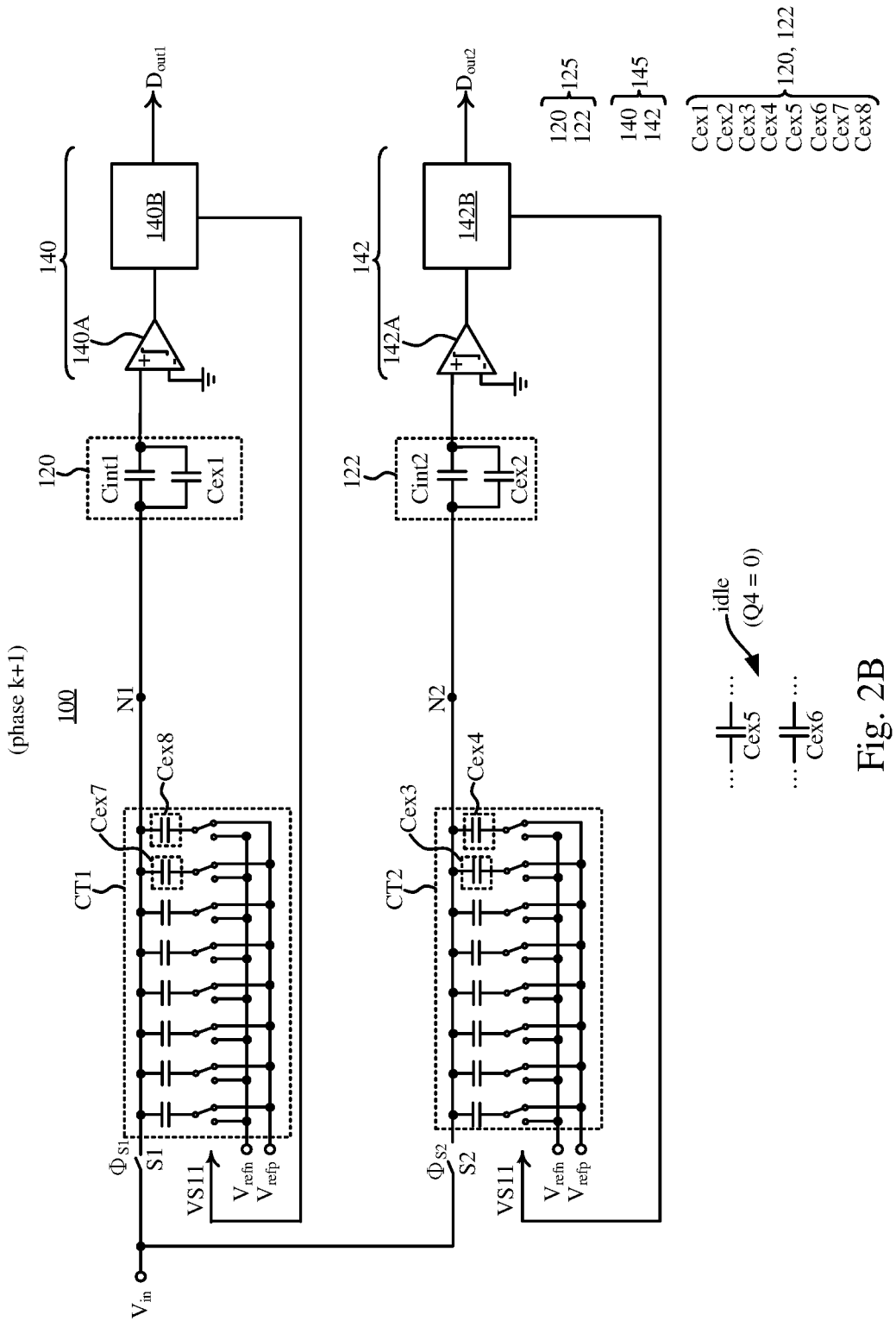
FIG. 2B is a schematic diagram of the time-interleaved ADC in FIG. 1 that operates during phase k+1 according to some embodiments of the present disclosure.

FIG. 2B is a schematic diagram of the time-interleaved ADC 100 in FIG. 1 that operates during phase k+1 according to some embodiments of the present disclosure. It is understood that, phase k+1 is a phase that follows the phase k.

During phase k+1, the pseudo random number Q4 has the logic value of 0. Under this condition, the at least one noise shaping circuitry 125 utilizes the switched-capacitor circuits Cex7 and Cex8 (i.e., the at least one second circuit) which previously stand idle. Accordingly, during phase k+1, the switched-capacitor circuits Cex7 and Cex8 are coupled between switches in the capacitor array circuit CT1 and the node N1 based on the switching signals VS2, in order to sample the input signal $V_{in}$ to generate the sampled input signal $V_{in}$(k+1) (not shown). On the other hand, the switched-capacitor circuits Cex5 and Cex6 are not utilized during phase k+1 and thus stand idle.

The switched-capacitor circuits Cex3 and Cex4 coupled between switches in the capacitor array circuit CT2 and the node N2, in order to perform the analog to digital conversion. In response to this analog to digital conversion, the residue signal Vres(k+1) (not shown) will be stored in in the switched-capacitor circuits Cex3 and Cex4. Based on the switching signals VS2, the switched-capacitor circuit Cex1 and the switched-capacitor circuit Cex2 are coupled in parallel with the capacitor Cint1 and the capacitor Cint2, respectively, in order to transfer the residue signal Vres(k) (not shown) which is generated during the previous phase k.

Figure 2C:
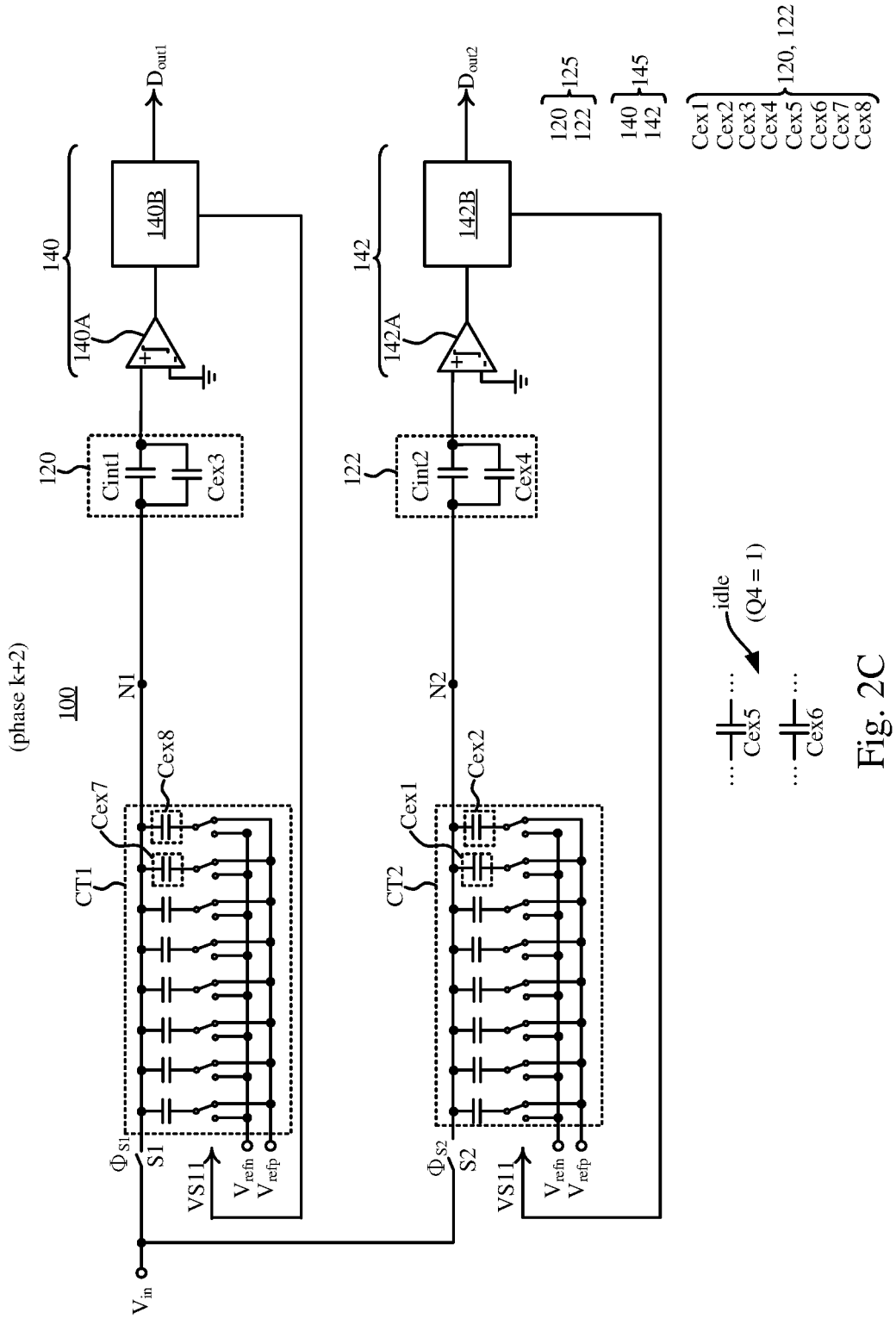
FIG. 2C is a schematic diagram of the time-interleaved ADC in FIG. 1 that operates during phase k+2 according to some embodiments of the present disclosure.

FIG. 2C is a schematic diagram of the time-interleaved ADC 100 in FIG. 1 that operates during phase k+2 according to some embodiments of the present disclosure. It is noted that, phase k+2 is a phase that follows phase k+1.

During phase k+2, the pseudo random number Q4 has the logic value of 1. Under this condition, the at least one noise shaping circuitry 125 utilizes the predetermined switched-capacitor circuits Cex1 and Cex2 (i.e., the switched-capacitor circuits coupled to the at least one noise shaping circuitry 125 in the previous phase k+1). Accordingly, during phase k+2, the switched-capacitor circuits Cex1 and Cex2 are coupled between the switches in the capacitor array circuit CT2 and the node N2 based on the switching signals VS2, in order to sample the input signal $V_{in}$ to generate the sampled input signal $V_{in}$(k+2) (not shown). On the other hand, the switched-capacitor circuits Cex5 and Cex6 are not utilized in phase k+2 and thus continue standing idle.

Based on the switching signals VS2, the switched-capacitor circuits Cex7 and Cex8 are coupled between the switches in the capacitor array circuit CT1 and the node N1, in order to perform the analog to digital conversion. In response to the analog to digital conversion, the residue signal Vres(k+2) (not shown) will be stored in the switched-capacitor circuits Cex7 and Cex8. In other words, the switched-capacitor circuits Cex7 and Cex8, which are randomly selected, are utilized to sample the input signal $V_{in}$ during phase k+1, and are utilized to generate the residue signal Vres(k+2) in a next phase k+2. The switched-capacitor circuit Cex3 and the switched-capacitor circuit Cex4 are coupled in parallel with the capacitor Cint1 and the capacitor Cint2, respectively, based on the switching signals VS2, in order to transfer the residue signal Vres(k+1) (not shown) that is generated in the previous phase k+1.

Figure 2D:
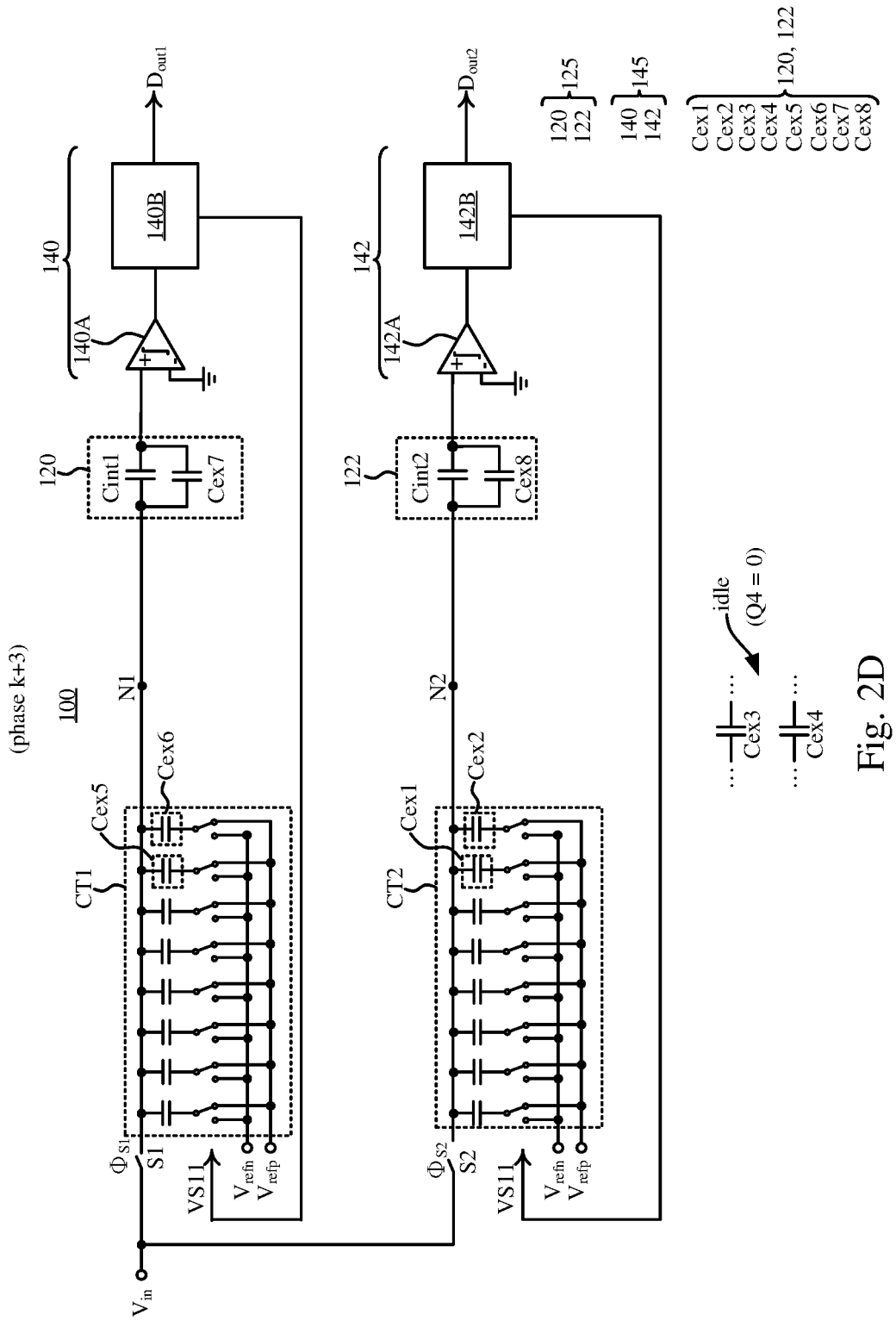
FIG. 2D is a schematic diagram of the time-interleaved ADC in FIG. 1 that operates in phase k+3 according to some embodiments of the present disclosure.

FIG. 2D is a schematic diagram of the time-interleaved ADC 100 in FIG. 1 that operates in phase k+3 according to some embodiments of the present disclosure. It is understood that, phase k+3 is a phase that follows phase k+2.

During phase k+3, the pseudo random number Q4 is the logic value of 0. Under this condition, the at least one noise shaping circuitry 125 utilizes the switched-capacitor circuits Cex5 and Cex6 which previously stand idle. Accordingly, during phase k+3, based on the switching signals VS2, the switched-capacitor circuits Cex5 and Cex6 are coupled between the switches in the capacitor array circuit CT1 and the node N1, in order to sample the input signal $V_{in}$ to generate the sampled input signal $V_{in}$(k+3) (not shown). On the other hand, the switched-capacitor circuits Cex3 and Cex4 are not utilized in phase k+3 and thus stand idle.

The switched-capacitor circuits Cex1 and Cex2 are coupled between the switches in the capacitor array circuit CT2 and the node N2 based on the switching signals VS2, in order to perform the analog to digital conversion. In response to the analog to digital conversion, the residue signal Vres(k+3) (not shown) will be stored in the switched-capacitor circuits Cex1 and Cex2. Based on the switching signals VS2, the switched-capacitor circuit Cex7 and the switched-capacitor circuit Cex8 are coupled in parallel with the capacitor Cint1 and the capacitor Cint2, respectively, in order to transfer the residue signal Vres(k+2) (not shown) that is stored in the previous phase k+2.

With reference to FIG. 2A to FIG. 2D, it is understood that, the at least one noise shaping circuitry 125 may randomly select a group of switched-capacitor circuits according to the pseudo random number Q4. This group of switched-capacitor circuits may perform the sampling operation during the current phase, and may store (or generate) the residue signal in a next phase. In some approaches (e.g., second reference), the residue signal is transferred by switching capacitors (e.g., the switched-capacitor circuits Cex1-Cex6 in the second reference) in a predetermined sequence to perform the noise shaping function. In practical applications, if mismatch(es) exist in these capacitors due to non-ideal factors (e.g., process variations), the transfer of the residue signal would be inaccurate. As a result, the output of the analog to digital conversation will be affected by noise(s) having harmonic tone, which results in a lower resolution. Compared with the above approaches, in some embodiments, additional switched-capacitor circuits (e.g., the switched-capacitor circuits Cex7-Cex8) are arranged in the at least one noise shaping circuitry 125, and one group of switched-capacitor circuits is randomly selected to perform the analog to digital conversion and the noise shaping function. As a result, it is able to avoid transferring the residue signal by utilizing the switched-capacitor circuits in a predetermined sequence in the operating progress, in order to lower impacts from noise(s) having harmonic tone.

It is understood that, the above arrangements are given with examples referred to the second reference, but the present disclosure is not limited thereto. For example, the above arrangements may be (but not limited to) replaced with other embodiments in the second reference (or the first reference). If the time-interleaved ADC 100 is implemented with reference to some embodiments in the first reference, each of the at least one first circuit, at least one second circuit, and at least one predetermined circuit is one switched-capacitor circuit.

Figure 3:
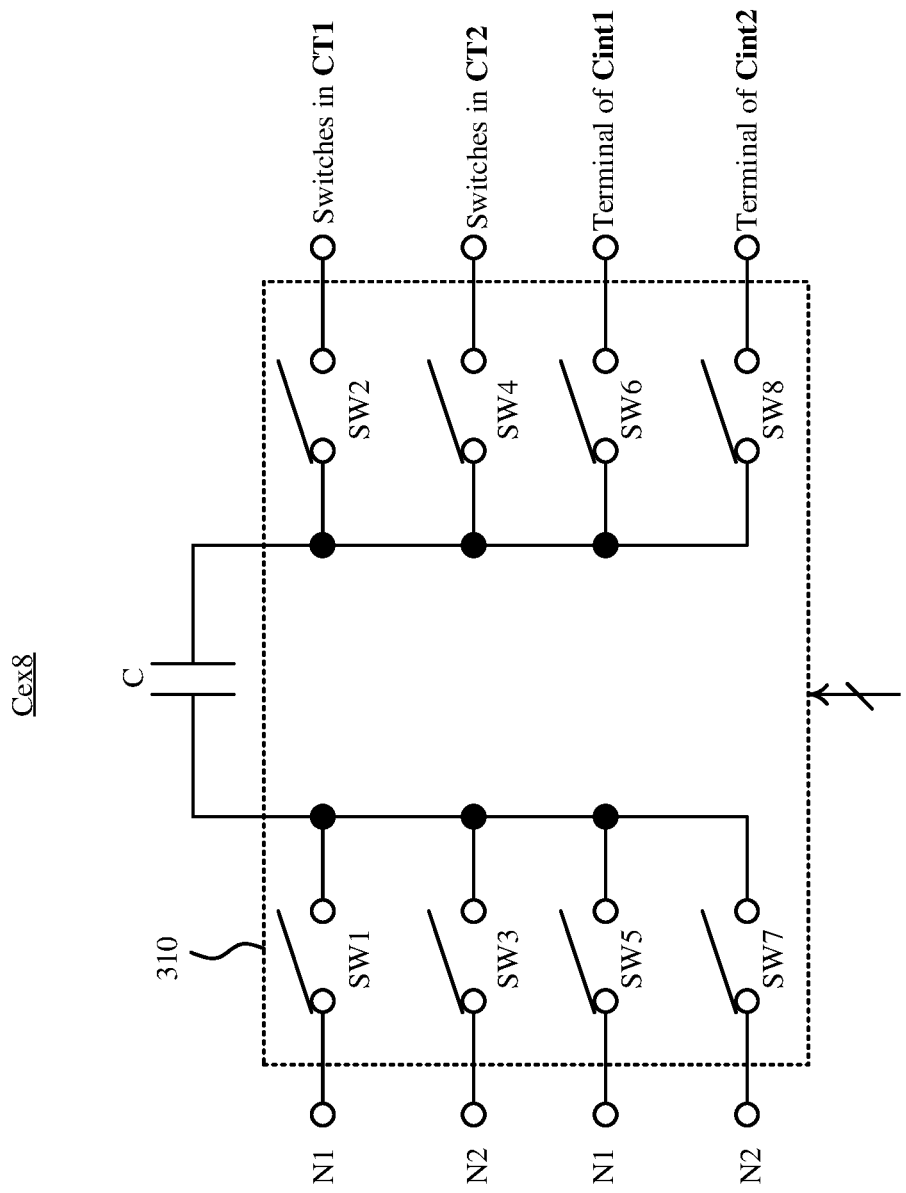
FIG. 3 is a schematic diagram of a switched-capacitor circuit in FIG. 2A according to some embodiments of the present disclosure.

FIG. 3 is a schematic diagram of the switched-capacitor circuit Cex8 in FIG. 2A according to some embodiments of the present disclosure. The switched-capacitor circuits Cex1-Cex8 have the same architecture. Taking the switched-capacitor circuit Cex8 as an example, the switched-capacitor circuit Cex8 includes switches SW1-SW8 and a capacitor C. A first terminal of the capacitor C is coupled to node N1, the node N2, the node N1, and the node N2 in FIG. 2A via the switch SW1, the switch SW5, and the switch SW7 respectively. A second terminal of the capacitor C is coupled to the switches in the capacitor array circuit CT1, the switches in the capacitor array circuit CT2, a terminal of the capacitor Cint1, and a terminal of the capacitor Cint2 in FIG. 2A via the switch SW2, the switch SW4, the switch SW6, and the switch SW8 respectively. The switches SW1-SW8 operate as a multiplexer circuit 310, which may selectively couple the capacitor C to a corresponding circuit according to the switching signals VS2, or may set the capacitor C to be idle.

For example, when the switches SW1 and SW2 are turned on and the remaining switches SW3-SW8 are not turned on, the switched-capacitor circuit Cex8 is coupled between the switches in the capacitor array circuit CT1 and the node N1. When the switches SW3 and SW4 are turned on and the remaining switches SW1-SW2 and SW5-SW8 are not turned on, the switched-capacitor circuit Cex8 is coupled between the switches in the capacitor array circuit CT2 and the node N2. When the switches SW5 and SW6 are turned on and the remaining switches SW1-SW4 and SW7-SW8 are not turned on, the switched-capacitor circuit Cex8 is coupled in parallel with the capacitor Cint1. When the switches SW7 and SW8 are turned on and the remaining switches SW1-SW6 are not turned on, the switched-capacitor circuit Cex8 is coupled in parallel with the capacitor Cint2.

Figure 4:
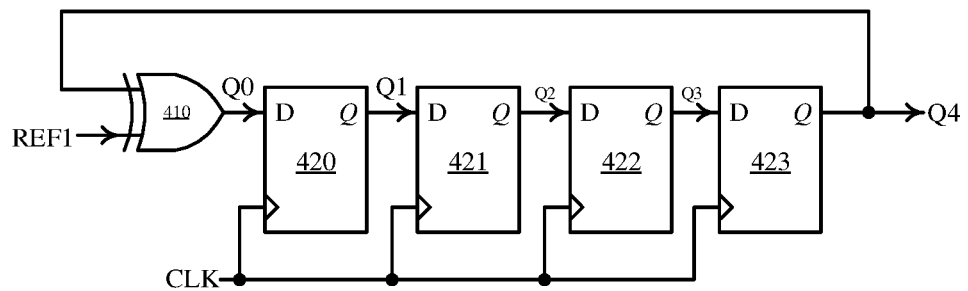
FIG. 4 is a schematic diagram of the pseudo random number generator circuit in FIG. 1 according to some embodiments of the present disclosure.

FIG. 4 is a schematic diagram of the pseudo random number generator circuit 160 in FIG. 1 according to some embodiments of the present disclosure. The pseudo random number generator circuit 160 includes a XOR gate circuit 410 and flip flop circuits 420-423. The XOR gate circuit 410 generate a signal Q0 according to a signal REF1 and the pseudo random number Q4. In some embodiments, each of the flip flop circuits 420-423 may be a D-type flip flop circuit. The flip flop circuits 420-423 are coupled in series, and sequentially transfer the signal Q0 according to the predetermined clock signal CLK to generate the pseudo random number Q4. For example, the flip flop circuit 420 outputs the signal Q0 to be a signal Q1 according to the predetermined clock signal CLK. The flip flop circuit 421 outputs the signal Q1 to be a signal Q2 according to the predetermined clock signal CLK. The flip flop circuit 422 outputs the signal Q2 to be a signal Q3 according to the predetermined clock signal CLK. The flip flop circuit 423 outputs the signal Q3 to be the pseudo random number Q4 according to the predetermined clock signal CLK. In some embodiments, the signal REF1 is a predetermined value.

The above arrangements about the switched-capacitor circuit Cex8 and/or the pseudo random number generator circuit 160 are given for illustrative purposes, and the present disclosure is not limited thereto. Various types of the switched-capacitor circuit Cex8 and/or the pseudo random number generator circuit 160 are within the contemplated scope of the present disclosure.

Figure 5:
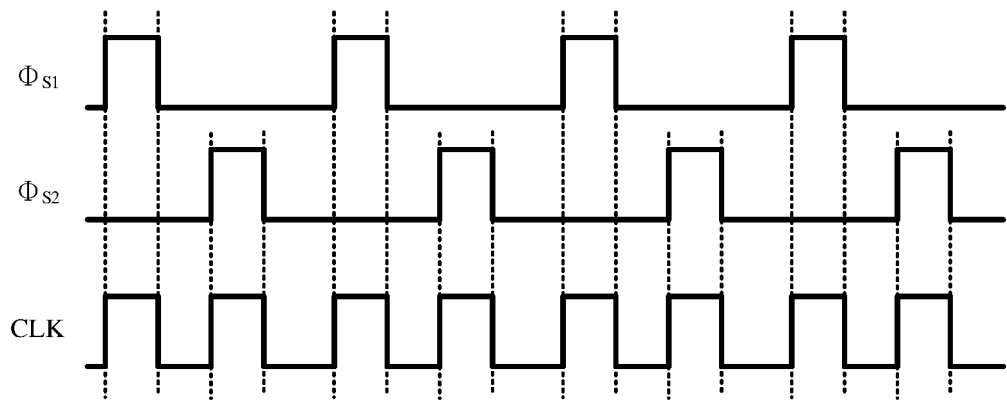
FIG. 5 is a schematic diagram showing waveforms of the clock signals and the predetermined clock signal in FIG. 1 according to some embodiments of the present disclosure.

FIG. 5 is a schematic diagram showing waveforms of the clock signal $\Phi_{S1}$, the clock signal $\Phi_{S2}$, and the predetermined clock signal CLK in FIG. 1 according to some embodiments of the present disclosure. During an interval of the clock signal $\Phi_{S1}$ being at a high level, the capacitor array circuit CT1 samples the input signal $V_{in}$. During an interval of the clock signal $\Phi_{S2}$ being at the high level, the capacitor array circuit CT2 samples the input signal $V_{in}$. During an interval of the predetermined clock signal CLK being at a high level, the pseudo random number generator circuit 160 outputs the pseudo random number Q4. As shown in FIG. 5, when the clock signal $\Phi_{S1}$ or the clock signal $\Phi_{S2}$ has the high level, the predetermined clock signal CLK has the high level. In other words, when each of the capacitor array circuits CT1 and CT2 samples the input signal $V_{in}$, the pseudo random number generator circuit 160 outputs the pseudo random number Q4.

Figure 6:
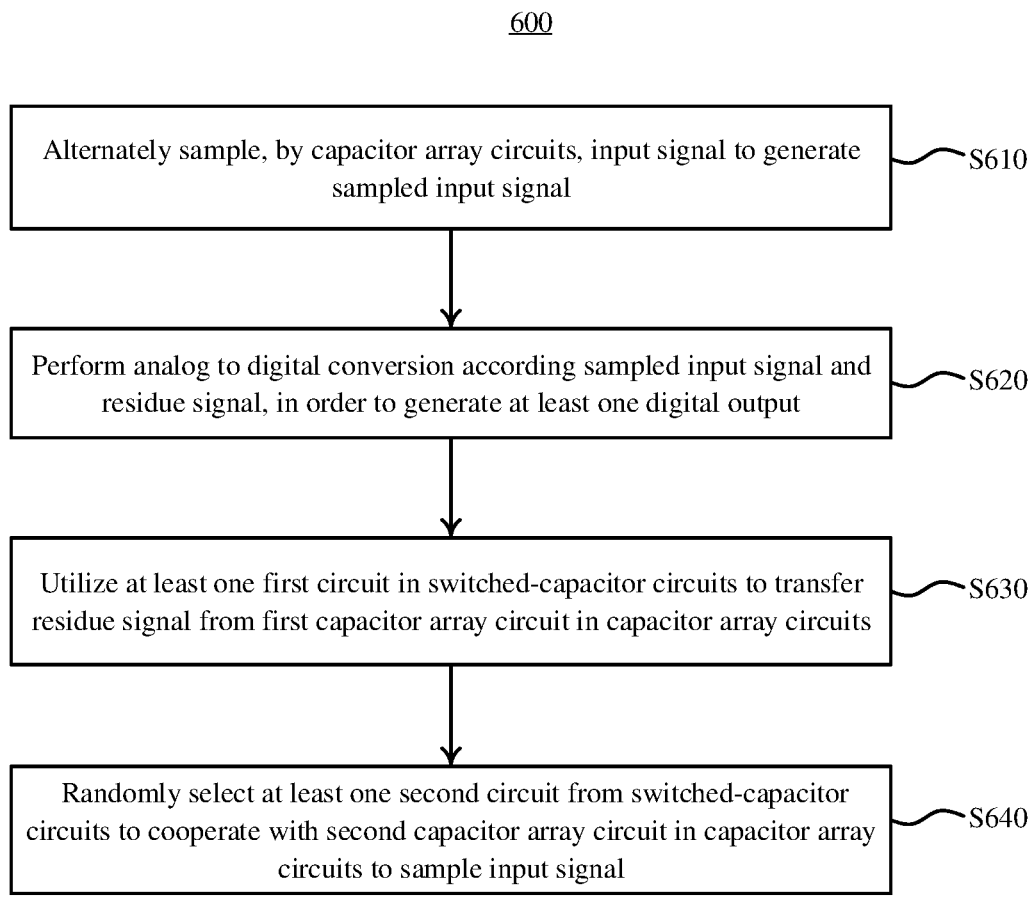
FIG. 6 is a flow chart of a signal conversion method according to some embodiments of the present disclosure.

FIG. 6 is a flow chart of a signal conversion method 600 according to some embodiments of the present disclosure. In operation S610, an input signal is alternately sampled by capacitor array circuits, in order to generate a sampled input signal. In operation S620, an analog to digital conversion is performed according the sampled input signal and a residue signal, in order to generate at least one digital output. In operation S630, at least one first circuit in switched-capacitor circuits is utilized to transfer the residue signal from a first capacitor array circuit in capacitor array circuits. In operation S640, at least one second circuit is randomly selected from the switched-capacitor circuits to cooperate with a second capacitor array circuit in the capacitor array circuits to sample the input signal.

The above operations can be understood with reference to the above embodiments, and thus the repetitious descriptions are not further given. The above description of the signal conversion method 600 includes exemplary operations, but the operations are not necessarily performed in the order described above. Operations of the signal conversion method 600 may be added, replaced, changed order, and/or eliminated as appropriate, or the operations are able to be executed simultaneously or partially simultaneously as appropriate, in accordance with the spirit and scope of various embodiments of the present disclosure.

As described above, the time-interleaved ADC and the signal conversion method in some embodiments of the present disclosure are able to randomly select a capacitor to perform the noise shaping function, in order to lower impacts from mismatches in the capacitors.

Various functional components or blocks have been described herein. As will be appreciated by persons skilled in the art, in some embodiments, the functional blocks will preferably be implemented through circuits (either dedicated circuits, or general purpose circuits, which operate under the control of one or more processors and coded instructions), which will typically comprise transistors or other circuit elements that are configured in such a way as to control the operation of the circuitry in accordance with the functions and operations described herein. As will be further appreciated, the specific structure or interconnections of the circuit elements will typically be determined by a compiler, such as a register transfer language (RTL) compiler. RTL compilers operate upon scripts that closely resemble assembly language code, to compile the script into a form that is used for the layout or fabrication of the ultimate circuitry. Indeed, RTL is well known for its role and use in the facilitation of the design process of electronic and digital systems.

The aforementioned descriptions represent merely some embodiments of the present disclosure, without any intention to limit the scope of the present disclosure thereto. Various equivalent changes, alterations, or modifications based on the claims of present disclosure are all consequently viewed as being embraced by the scope of the present disclosure.

What is claimed is:

1. A time-interleaved analog to digital converter, comprising:
   a plurality of capacitor array circuits configured to alternately sample an input signal, in order to generate a sampled input signal;
   at least one successive approximation register circuitry configured to perform an analog to digital conversion according to the sampled input signal and a residue signal, in order to generate at least one digital output; and
   at least one noise shaping circuitry configured to utilize at least one first circuit in a plurality of switched-capacitor circuits to transfer the residue signal from a first capacitor array circuit in the plurality of capacitor array circuits, and randomly select at least one second circuit from the plurality of switched-capacitor circuits to cooperate with a second capacitor array circuit in the plurality of capacitor array circuits to sample the input signal.

2. The time-interleaved analog to digital converter of claim 1, wherein the at least one successive approximation register circuitry is further configured to generate a plurality of switching signals according to a pseudo random number, and the at least one noise shaping circuitry is further configured to select the at least one second circuit according to the plurality of switching signals.

3. The time-interleaved analog to digital converter of claim 2, further comprising:
   a pseudo random number generator circuit configured to generate the pseudo random number according to a predetermined clock signal.

4. The time-interleaved analog to digital converter of claim 3, wherein the pseudo random number generator circuit comprises:
   a XOR gate circuit configured to generate a second signal according to a first signal and the pseudo random number; and
   a plurality of flip flop circuits coupled in series and configured to sequentially transfer the second signal according to the predetermined clock signal to generate the pseudo random number.

5. The time-interleaved analog to digital converter of claim 3, wherein the pseudo random number generator circuit is configured to output the pseudo random number when each of the plurality of capacitor array circuits samples the input signal.

6. The time-interleaved analog to digital converter of claim 3, wherein when the pseudo random number has a first logic value, the at least one noise shaping circuitry is configured to utilize the at least one second circuit to cooperate with the second capacitor array circuit to sample the input signal, in order to generate the sampled input signal.

7. The time-interleaved analog to digital converter of claim 6, wherein the at least one second circuit is disconnected from the plurality of capacitor array circuits and the at least one noise shaping circuitry during a previous phase.

8. The time-interleaved analog to digital converter of claim 6, wherein when the pseudo random number has a second logic value, the at least one noise shaping circuitry is configured to utilize at least one predetermined circuit in the plurality of switched-capacitor circuits to cooperate with the second capacitor array circuit to sample the input signal, in order to generate the sampled input signal.

9. The time-interleaved analog to digital converter of claim 8, wherein the at least one predetermined circuit is coupled to the at least one noise shaping circuitry in a previous phase.

10. The time-interleaved analog to digital converter of claim 1, wherein the at least one second circuit is further configured to generate the residue signal in a next phase.

11. A signal conversion method, comprising:
    alternately sampling, by a plurality of capacitor array circuits, an input signal, in order to generate a sampled input signal;
    performing an analog to digital conversion according to the sampled input signal and a residue signal, in order to generate at least one digital output;
    utilizing at least one first circuit in a plurality of switched-capacitor circuits to transfer the residue signal from a first capacitor array circuit in the plurality of capacitor array circuits; and
    randomly selecting at least one second circuit from the plurality of switched-capacitor circuits to cooperate with a second capacitor array circuit in the plurality of capacitor array circuits to sample the input signal.

12. The signal conversion method of claim 11, wherein randomly selecting the at least one second circuit from the plurality of switched-capacitor circuits to cooperate with the second capacitor array circuit to sample the input signal comprises:
    generating a plurality of switching signals according to a pseudo random number; and
    selecting the at least one second circuit according to the plurality of switching signals.

13. The signal conversion method of claim 12, further comprising:
    generating the pseudo random number according to a predetermined clock signal.

14. The signal conversion method of claim 13, wherein generating the pseudo random number according to the predetermined clock signal comprises:
    outputting the pseudo random number when each of the plurality of capacitor array circuits samples the input signal.

15. The signal conversion method of claim 13, wherein generating the pseudo random number according to the predetermined clock signal comprises:
    generating, by a XOR gate circuit, a second signal according to a first signal and the pseudo random number; and
    generating, by a plurality of flip flop circuits, sequentially transfer the second signal according to the predetermined clock signal to generate the pseudo random number, wherein the plurality of flip flop circuits are coupled in series.

16. The signal conversion method of claim 13, wherein randomly selecting the at least one second circuit from the plurality of switched-capacitor circuits to cooperate with the second capacitor array circuit to sample the input signal comprises:
    when the pseudo random number has a first logic value, utilizing the at least one second circuit to cooperate with the second capacitor array circuit to sample the input signal, in order to generate the sampled input signal.

17. The signal conversion method of claim 16, wherein the at least one second circuit is disconnected from the plurality of capacitor array circuits and the at least one noise shaping circuitry during a previous phase.

18. The signal conversion method of claim 16, further comprising:
    when the pseudo random number has a second logic value, utilizing at least one predetermined circuit in the plurality of switched-capacitor circuits to cooperate with the second capacitor array circuit to sample the input signal, in order to generate the sampled input signal.

19. The signal conversion method of claim 18, wherein the at least one predetermined circuit is coupled to the at least one noise shaping circuitry in a previous phase.

20. The signal conversion method of claim 11, wherein the at least one second circuit is further configured to generate the residue signal in a next phase.

\* \* \* \* \*